(12) United States Patent
Jeong et al.

(10) Patent No.: US 10,403,649 B2
(45) Date of Patent: Sep. 3, 2019

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Woonghee Jeong, Seoul (KR); Taehoon Yang, Yongin-si (KR); Kyoungwon Lee, Seoul (KR); Jongchan Lee, Suwon-si (KR); Yongsu Lee, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/869,748

(22) Filed: Jan. 12, 2018

(65) Prior Publication Data

US 2018/0366493 A1 Dec. 20, 2018

(30) Foreign Application Priority Data

Jun. 16, 2017 (KR) ........................ 10-2017-0076839

(51) Int. Cl.
| | |
|---|---|
| *H01L 23/52* | (2006.01) |
| *H01L 21/44* | (2006.01) |
| *H01L 27/12* | (2006.01) |
| *H01L 27/32* | (2006.01) |

(52) U.S. Cl.
CPC ........ *H01L 27/124* (2013.01); *H01L 27/3276* (2013.01); *H01L 27/3258* (2013.01)

(58) Field of Classification Search
CPC ..................................................... H01L 27/124
USPC .............................. 438/36, 655; 257/84, 754
See application file for complete search history.

(56) References Cited

U.S. PATENT DOCUMENTS

| | | | | |
|---|---|---|---|---|
| 9,935,137 B2 * | 4/2018 | He | .................... | G02F 1/133514 |
| 10,101,620 B2 * | 10/2018 | Deng | ................ | H01L 29/78633 |
| 2016/0291431 A1 | 10/2016 | Hu et al. | | |

FOREIGN PATENT DOCUMENTS

| | | |
|---|---|---|
| KR | 10-1002666 B1 | 12/2010 |
| KR | 10-2016-0027904 A | 10/2016 |

* cited by examiner

*Primary Examiner* — Calvin Lee
(74) *Attorney, Agent, or Firm* — Lee & Morse, P.C.

(57) ABSTRACT

A display device includes a common active pattern, a first gate electrode, and a second gate electrode. The common active pattern includes an NMOS area, a PMOS area, and a silicide area in a same layer as the NMOS area and the PMOS area. The silicide area electrically connects the NMOS area to the PMOS area. The NMOS area includes a first channel area and an n-doped area contacting the first channel area. The PMOS area includes a second channel area and a p-doped area contacting the second channel area. The first gate electrode overlaps the first channel area, and the second gate electrode overlaps the second channel area.

11 Claims, 31 Drawing Sheets

DISPLAY DEVICE AND METHOD OF MANUFACTURING THE SAME

CROSS-REFERENCE TO RELATED APPLICATION

Korean Patent Application No. 10-2017-0076839 filed on Jun. 16, 2017, and entitled, "Display Device and Method of Manufacturing the Same," is incorporated by reference herein in its entirety.

BACKGROUND

1. Field

One or more embodiments described herein relate to a display device and a method for manufacturing a display device.

2. Description of the Related Art

A variety of displays have been developed. Examples include liquid crystal displays and organic light-emitting displays. The pixels of these displays include thin film transistors. Channels of the thin film transistors may include amorphous silicon, polycrystalline silicon (polysilicon), or oxide semiconductor. An organic light-emitting display often uses polysilicon as the channel material. Polysilicon has a relatively higher carrier mobility and thus may be used to form PMOS or NMOS transistors.

Attempts are continually being made to increase the integration of display circuits. One approach attempts to integrate wirings and reduce the sizes of thin film transistors in order to increase integration, and at the same time achieve high resolution.

The thin film transistors may be arranged in a CMOS configuration in order to improve driving efficiency. In a CMOS configuration, n-doped and p-doped areas do not directly (or physically) contact each other because of differences in their electrically characteristics. However, the n-doped and p-doped areas are electrically connected to each other by a bridge formed from metal wiring. The process for forming the bridge may damage or otherwise cause defects in the display. Also, manufacturing costs are increased because of the use of an additional mask for forming the bridge.

SUMMARY

In accordance with one or more embodiments, a display device includes a common active pattern including an NMOS area, a PMOS area and a silicide area in a same layer as the NMOS area and the PMOS area and electrically connecting the NMOS area to the PMOS area, the NMOS area including a first channel area and an n-doped area contacting the first channel area, the PMOS area including a second channel area and a p-doped area contacting the second channel area; a first gate electrode overlapping the first channel area; and a second gate electrode overlapping the second channel area.

A width of the silicide area may be equal to a width of the NMOS area or the PMOS area adjacent to the silicide area. The silicide area may include at least one of titanium silicide, nickel silicide, tantalum silicide, platinum silicide, cobalt silicide, and tungsten silicide. A thickness of the silicide area may be equal to a thickness of the NMOS area or the PMOS area adjacent to the silicide area. A thickness of the silicide area may be greater than a thickness of the NMOS area or the PMOS area adjacent to the silicide area. A depth of a silicidized portion in the silicide area may be about 10 Å to about 1,000 Å.

The n-doped area may include a first high-concentration n-doped area, the first low-concentration n-doped area, a second low-concentration n-doped area, and a second high-concentration n-doped area, the p-doped area may include a first p-doped area and a second p-doped area, and the silicide area may contact the first high-concentration n-doped area and the second p-doped area.

The display device may include a first insulation layer covering the common active pattern, and the first gate electrode and the second gate electrode may be on the first insulation layer. The display device may include a second insulation layer covering the first gate electrode, the second gate electrode, and the first insulation layer; and a silicide metal pattern passing through the first insulation layer and the second insulation layer to contact the silicide area.

The display device may include a source electrode passing through the first insulation layer and the second insulation layer to contact the common active pattern; and a drain electrode passing through the first insulation layer and the second insulation layer to contact the common active pattern, wherein the silicide metal pattern is in a same layer as the source electrode and the drain electrode. The display device may include an organic light-emitting diode to receive a driving current through the common active pattern.

In accordance with one or more other embodiments, a method for manufacturing a display device includes forming a common active pattern including a first active area, a second active area spaced apart from the first active area, and a silicide area between the first active area and the second active area; partially doping the first active area to form an NMOS area including a first channel area and an n-doped area contacting the first channel area; and partially doping the second active area to form a PMOS area including a second channel area and a p-doped area contacting the second channel area.

Forming the common active pattern may include forming a semiconductor pattern including polysilicon on a base substrate; forming a silicide metal pattern on the semiconductor pattern; and heating the semiconductor pattern and the silicide metal pattern to form the silicide area. The silicide metal pattern may include at least one of titanium, nickel, tantalum, platinum, cobalt, and tungsten. A width of the silicide metal pattern may be equal to a width of the semiconductor pattern. A width of the silicide metal pattern may be greater than a width of the semiconductor pattern.

Forming the common active pattern may include forming an amorphous silicon layer on a base substrate; forming a silicide metal pattern on the amorphous silicon layer; and heating the amorphous silicon layer and the silicide metal pattern to form the silicide area and polysilicon.

In accordance with one or more other embodiments, a method for manufacturing a display device includes forming a semiconductor pattern on a base substrate; forming a first insulation layer covering the semiconductor pattern; forming a first gate electrode on the first insulation layer; forming a second gate electrode spaced apart from the first gate electrode on the first insulation layer; partially doping the semiconductor pattern to form an NMOS area including a first channel area and an n-doped area contacting the first channel area; partially doping the semiconductor pattern to form a PMOS area including a second channel area and a p-doped area contacting the second channel area; forming a second insulation layer covering the first gate electrode and the second gate electrode; forming a silicide metal pattern passing through the first insulation layer and the second insulation layer to contact the semiconductor pattern; and forming a silicide area electrically connecting the NMOS area to the PMOS area.

The method may include forming a third insulation layer covering the silicide metal pattern; and forming a plurality of electrodes passing through the first insulation layer, the second insulation layer and the third insulation layer to be connected to the NMOS area or the PMOS area. Forming the silicide metal pattern may include etching the first insulation layer and the second insulation layer to expose the n-doped area and the p-doped area; forming a data metal layer on the second insulation layer; and pattering the data metal layer to form the silicide metal pattern and a plurality of electrodes connected to the NMOS area or the PMOS area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
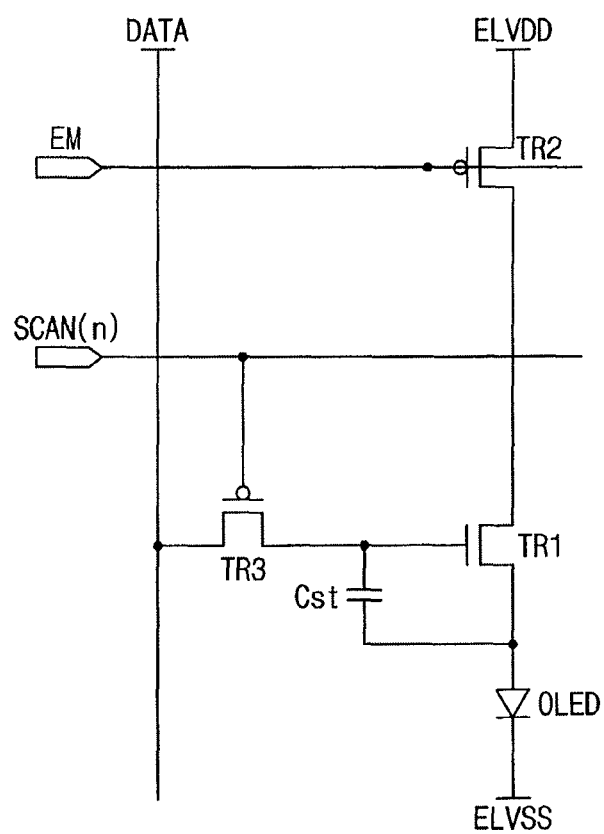
FIG. 1 illustrates an embodiment of a pixel.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a circuit embodiment of a pixel of a display device, which, for example, is an organic light-emitting display device which may include an array of pixels PX.

Referring to FIG. 1, each pixel PX may include an organic light-emitting diode OLED, a first transistor TR1, a second transistor TR2, a third transistor TR3, and a storage capacitor Cst. The organic light-emitting diode OLED may emit light based on a driving current. The organic light-emitting diode OLED may include a first terminal and a second terminal. In an exemplary embodiment, the first terminal of the organic light-emitting diode OLED may receive a first power voltage ELVDD, and the second terminal of the organic light-emitting diode OLED may receive a second power voltage ELVSS. In an exemplary embodiment, the first terminal may be an anode and the second terminal may be a cathode.

The first transistor TR1 may include a gate terminal, a first terminal, and a second terminal. The first terminal of the first transistor TR1 may be connected to the second transistor TR2. The second terminal of the first transistor TR1 may be connected to the organic light-emitting diode OLED. The gate terminal of the first transistor TR1 may be connected to the third transistor TR3.

The first transistor TR1 may generate the driving current based on the first power voltage ELVDD applied thereto. In an exemplary embodiment, a gray scale value of light may be implemented based on an amount of the driving current provided to the organic light-emitting diode OLED. In one exemplary embodiment, gray scale may be implemented based on summation of time during which the driving current is provided to the organic light-emitting diode OLED within one frame.

The second transistor TR2 may include a gate terminal, a first terminal, and a second terminal. The gate terminal may receive an emission signal EM. The first terminal may receive the first power voltage ELVDD. The second terminal may be connected to the first terminal of the first transistor TR1.

The second transistor TR2 may provide the first power voltage ELVDD to the first terminal of the first transistor TR1 during an active period of the emission signal EM. Furthermore, the second transistor TR2 may cut the first power voltage ELVDD during an inactive period of the emission signal EM. The first transistor TR1 may generate the driving current when the first power voltage ELVDD is provided to the first terminal of the first transistor TR1 during the active period of the emission signal EM.

The third transistor TR3 may include a gate terminal, a first terminal, and a second terminal. The gate terminal may receive a scan signal Scan[n] from a scan line (or a gate line). The first terminal may be connected to a data line to receive a data signal DATA, and the second terminal may be connected to the gate terminal of the first transistor TR1. The third transistor TR3 may provide the data signal DATA to the gate terminal of the first transistor TR1 during an active period of the scan signal Scan[n] of a current stage.

The storage capacitor Cst may be connected to and between the second terminal of the third transistor TR3 and the first terminal of the organic light-emitting diode OLED. Thus, the driving current generated by the first transistor TR1 may be provided to the organic light-emitting diode OLED based on a voltage level maintained by the storage capacitor Cst. In an exemplary embodiment, the first transistor TR1 may be an NMOS transistor and the second transistor TR2 and the third transistor TR3 may be PMOS transistors.

Figure 15:
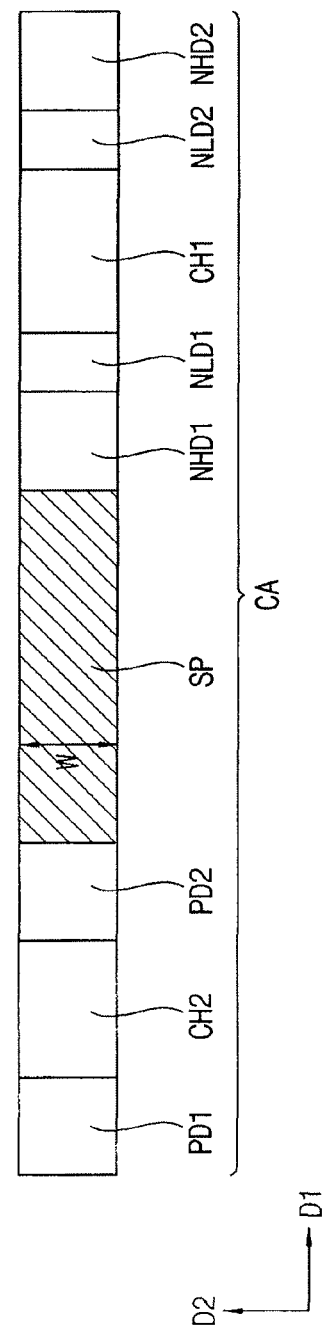
FIG. 15 illustrates an embodiment of a common active pattern of a display device.
Figure 16:
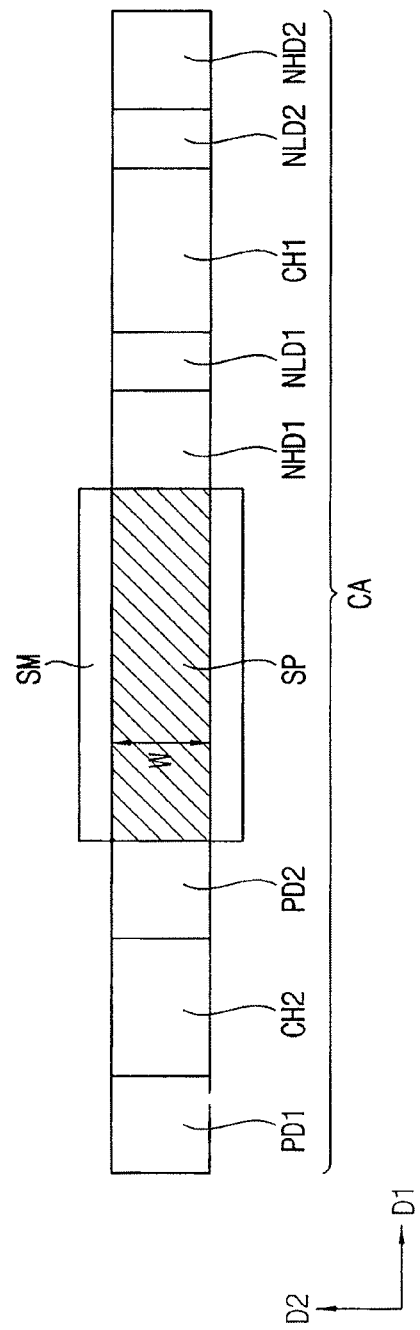
FIG. 16 illustrates an embodiment of a common active pattern and a remaining silicide metal pattern of a display device.

FIGS. 2-14 illustrate cross-sectional views of various stages of an embodiment of a method for manufacturing a display device, which may include the first transistor TR1 and the second transistor TR2. The third transistor TR3 may be manufactured by a same method as the second transistor TR2. FIG. 15 illustrates a plan view of an embodiment of a common active pattern of a display device. FIG. 16 illustrates a plan view illustrating of an embodiment of a common active pattern and a remaining silicide metal pattern of a display device.

Figure 2:
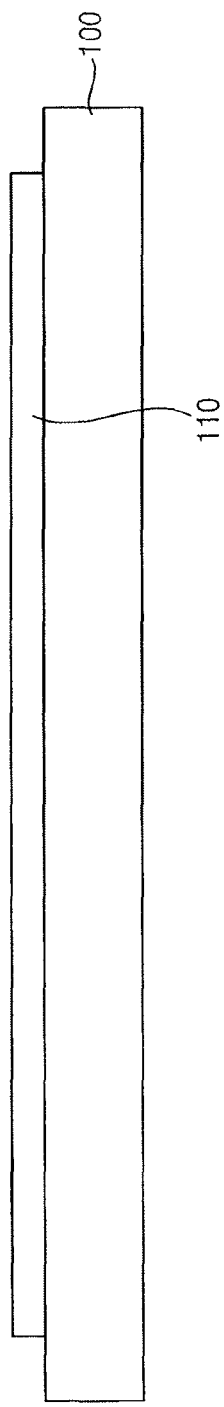
FIGS. 2-14 illustrate various stages of an embodiment of a method for manufacturing an organic light-emitting display device.

Referring to FIG. 2, a semiconductor pattern 110 is formed on a base substrate 100. The base substrate 100 may include, for example, an insulating material such as glass, quartz, or a polymer. The polymer may include, for example, polyethylene terephthalate, polyethylene naphthalate, polyether ketone, polycarbonate, polyarylate, polyether sulfone, or polyimide.

The semiconductor pattern 110 may include, for example, polysilicon. In order to form the semiconductor pattern, an amorphous silicon layer may be formed on the base substrate 100 and then crystallized to form a polysilicon layer. The amorphous silicon layer may be formed, for example, through sputtering, low-pressure chemical vapor deposition (LPCVD), or plasma-enhanced chemical vapor deposition (PECVD). The amorphous silicon layer may be crystallized through excimer laser annealing (ELA), sequential lateral solidification (SLS), or another process.

The polysilicon layer may be polished, for example, by chemical mechanical polishing (CMP) or the like to planarize a surface thereof. Thereafter, the polysilicon layer may be patterned, for example, by photolithography to form the semiconductor pattern 110. The semiconductor pattern 110 may be doped with n-type impurities or p-type impurities.

Figure 3:
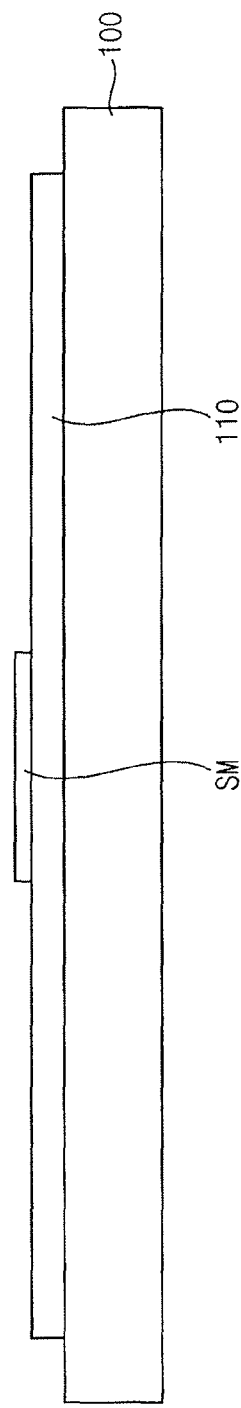

Referring to FIG. 3, a silicide metal pattern SM is formed to partially cover the semiconductor pattern 110. The silicide metal pattern SM may include a metal appropriate for forming a silicide, for example, titanium (Ti), nickel (Ni), tantalum (Ta), platinum (Pt), cobalt (Co), or tungsten (W). The silicide metal pattern SM may have a single-layered structure or a multiple-layered structure. When the silicide metal pattern SM has a multiple-layered structure, the silicide metal pattern SM may further include, for example, gold (Au), silver (Ag), aluminum (Al), copper (Cu), magnesium (Mg), chrome (Cr), or molybdenum (Mo). The silicide metal pattern SM may be formed by physical deposition such as sputtering, chemical vapor deposition, plasma-enhanced chemical vapor deposition, or another process. In an exemplary embodiment, the silicide metal pattern SM may include titanium. The thickness of the silicide metal pattern SM may be, for example, about 10 Å to about 1,000 Å.

Figure 4:
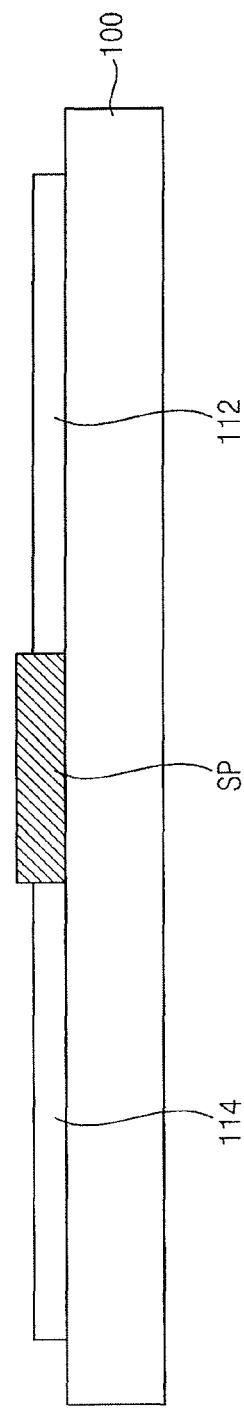

Referring to FIG. 4, a portion of the semiconductor pattern 110, which overlaps the silicide metal pattern SM, is changed to a silicide through a heating process to form a silicide area SP. The heating process may be performed, for example, at a temperature of about 700° C.

The silicide area SP includes a silicide of a metal in the silicide metal pattern SM. For example, the silicide area SP may include titanium silicide, nickel silicide, tantalum silicide, platinum silicide, cobalt silicide, tungsten silicide or a combination thereof. The silicide area SP may partially include a material that is not silicidized. For example, a portion of the silicide area SP may include polysilicon or metal, which is not silicidized.

The depth of a substantially-silicidized portion in the silicide area SP may be, for example, about 10 Å to about 1,000 Å. A thin film resistance of the silicide area SP may be about $10\mu\Omega$cm to about 1,000 $\mu\Omega$cm. As the silicide area SP is formed, the semiconductor pattern 110 may be divided into a first active area 112 and a second active area 114 spaced apart from the first active area 112 by the silicide area SP. A portion of the silicide metal pattern SM may not be silicidized to remain as a metal on the silicide area SP. The remaining silicide metal pattern SM may be removed.

Figure 5:
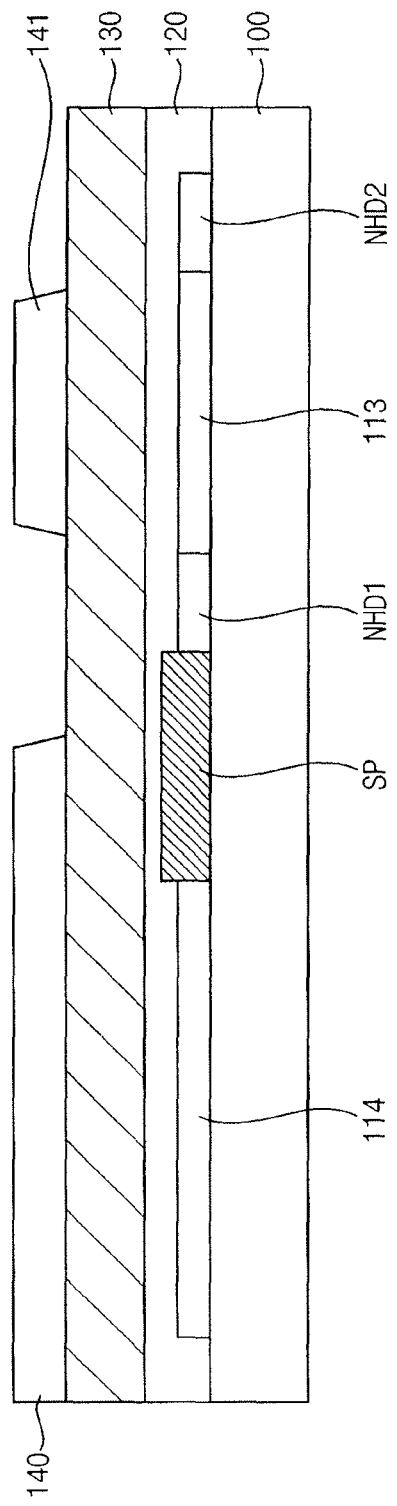

Referring to FIG. 5, a first insulation layer 120 is formed to cover the semiconductor pattern 110. The first insulation layer 120 may insulate a channel, which is formed from the semiconductor pattern 110, from a gate electrode formed on the first insulation layer 120.

The first insulation layer 120 may include, for example, silicon oxide, silicon nitride, silicon carbide, or a combination thereof. Furthermore, the first insulation layer 120 may include an insulating metal oxide such as aluminum oxide, tantalum oxide, hafnium oxide, zirconium oxide, titanium oxide, or another metal oxide. The first insulation layer 120 may have a single-layered structure or a multiple-layered structure including, for example, silicon nitride and/or silicon oxide.

Thereafter, a gate metal layer 130 is formed on the first insulation layer 120, and a first photoresist layer 140 is formed on the gate metal layer 130. The gate metal layer 130 may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The gate metal layer 130 may have a single-layered structure or a multiple-layered structure including different metal layers. In an exemplary embodiment, the gate metal layer 130 may have a relatively large thickness, for example, equal to or more than 1 µm to achieve high resolution. The gate metal layer 130 may have a different thickness (e.g., less than 1 µm) in another exemplary embodiment.

The first photoresist layer 140 is patterned to partially expose the gate metal layer 130. For example, the first photoresist layer 140 may include a first mask pattern 141 partially overlapping the first active area 112. A photoresist composition including a binder resin (e.g., phenol resin, acryl resin, or another resin) may be coated, exposed to light, and developed to form the first photoresist layer 140.

Figure 6:
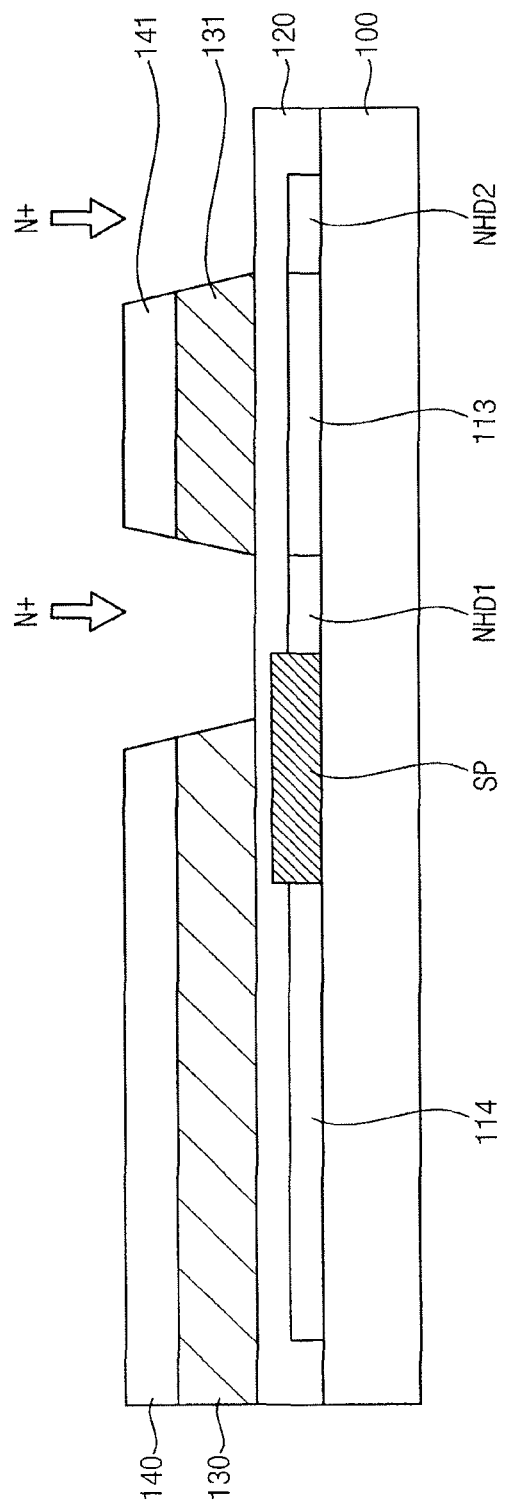

Referring to FIG. 6, the gate metal layer 130 is etched using the first photoresist layer 140 including the first mask pattern 141 to form a gate preliminary pattern 131. The gate metal layer 130 may be etched by a dry-etching process using plasma or another process.

As the gate preliminary pattern 131 is formed, the first insulation layer 120 may be partially exposed in an area surrounding or adjacent to the gate preliminary pattern 131. Furthermore, the first insulation layer 120 may be partially etched by the dry-etching process to have a reduced thickness.

Thereafter, n-type impurities (e.g., phosphorus, arsenic, or another material) may be provided to the first active area 112 through an exposed portion of the first insulation layer 120 with a predetermined high concentration. In the first active area 112, a gate-overlapping portion 113, which overlaps the gate preliminary pattern 131, is protected by the gate preliminary pattern 131 to remain without being doped. A peripheral portion of the first active area 112, which does not overlap the gate preliminary pattern 131, is doped with n-type impurities with a high concentration to form a first high-concentration n-doped area NHD1 and a second high-concentration n-doped area NHD2. The second active area 114 is protected by the gate metal layer 130 remaining on the second active area 114. Thus, the second active area 114 remains without being doped.

Figure 7:
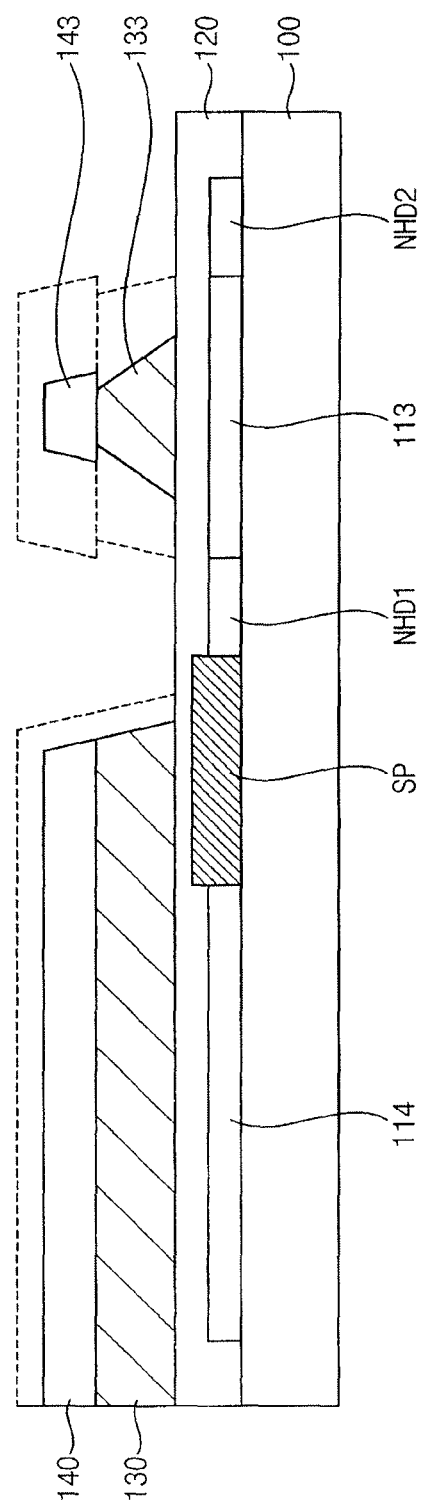

Referring to FIG. 7, the gate preliminary pattern 131 and the first mask pattern 141 are etched by an ashing process. The width of the gate preliminary pattern 131 is reduced as a result of the ashing process to form a first gate electrode 133. The ashing process may etch and thus skew a side surface of the gate preliminary pattern 131. Thus, the first gate electrode 133 may have a taper angle less than the gate preliminary pattern 131. The taper angle may be an angle between a lower surface and a side surface of a metal pattern.

As a result of the ashing process, the width of the gate preliminary pattern 131 is reduced to expose the first insulation layer 120 in an area surrounding or adjacent to the first gate electrode 133. The ashing process may be performed, for example, using plasma. The ashing process may etch a metal, an inorganic insulating material and an organic insulating material like a dry-etching process. Thus, the gate preliminary pattern 131, the first photoresist layer 140 including the first mask pattern 141, and the first insulation layer 120 may be partially etched by the ashing process.

Figure 8:
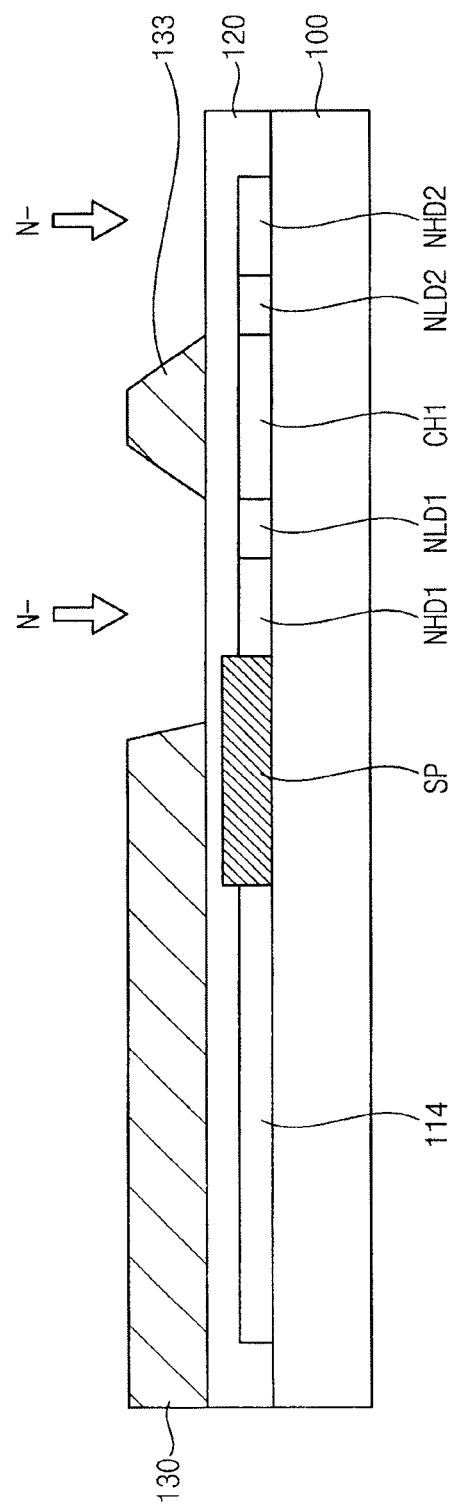
Figure 9:
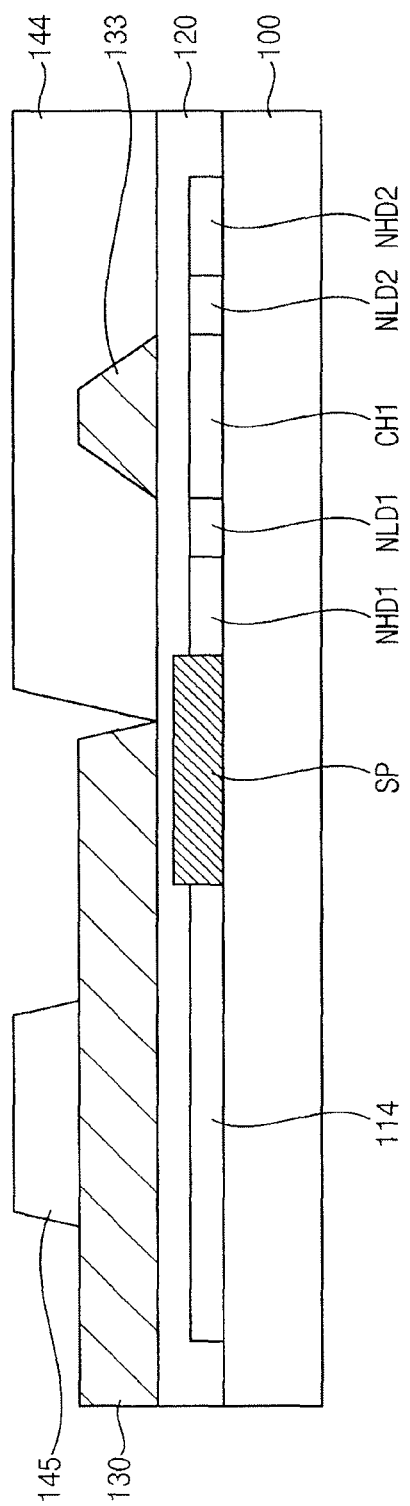

Referring to FIG. 8, n-type impurities (e.g., phosphorus, arsenic, or another material) may be provided to the gate-overlapping portion 113 through an exposed portion of the first insulation layer 120 with a predetermined low concentration. Thus, a peripheral portion of the gate-overlapping portion 113, which does not overlap the first gate electrode 133, is doped with n-type impurities with a predetermined low concentration to form a first low-concentration n-doped area NLD1 and a second low-concentration n-doped area NLD2. In the gate-overlapping portion 113, a portion overlapping the first gate electrode 133 is protected by the first gate electrode 133. Thus, the portion remains without being doped to define a first channel area CH1.

In an exemplary embodiment, the first low-concentration n-doped area NLD1 may contact the silicide area SP. The process for providing the n-type impurities with a predetermined low concentration may be performed after or before the first photoresist layer 140 and a remaining mask pattern 143 are removed.

The length of the first low-concentration n-doped area NLD1 and the second low-concentration n-doped area NLD2 may vary depending on the manufacturing process and/or desired device characteristics. For example, the length of the first low-concentration n-doped area NLD1 and the second low-concentration n-doped area NLD2 may be about 0.2 μm to about 2 μm Referring to FIG. 9, a second photoresist layer 144 is formed to cover the first gate electrode 133, the first insulation layer 120, and the gate metal layer 130. The second photoresist layer 144 may be patterned to partially expose the gate metal layer 130. The second photoresist layer 144 may include, for example, a second mask pattern 145 partially overlapping the second active area 114 and the gate metal layer 130.

Figure 10:
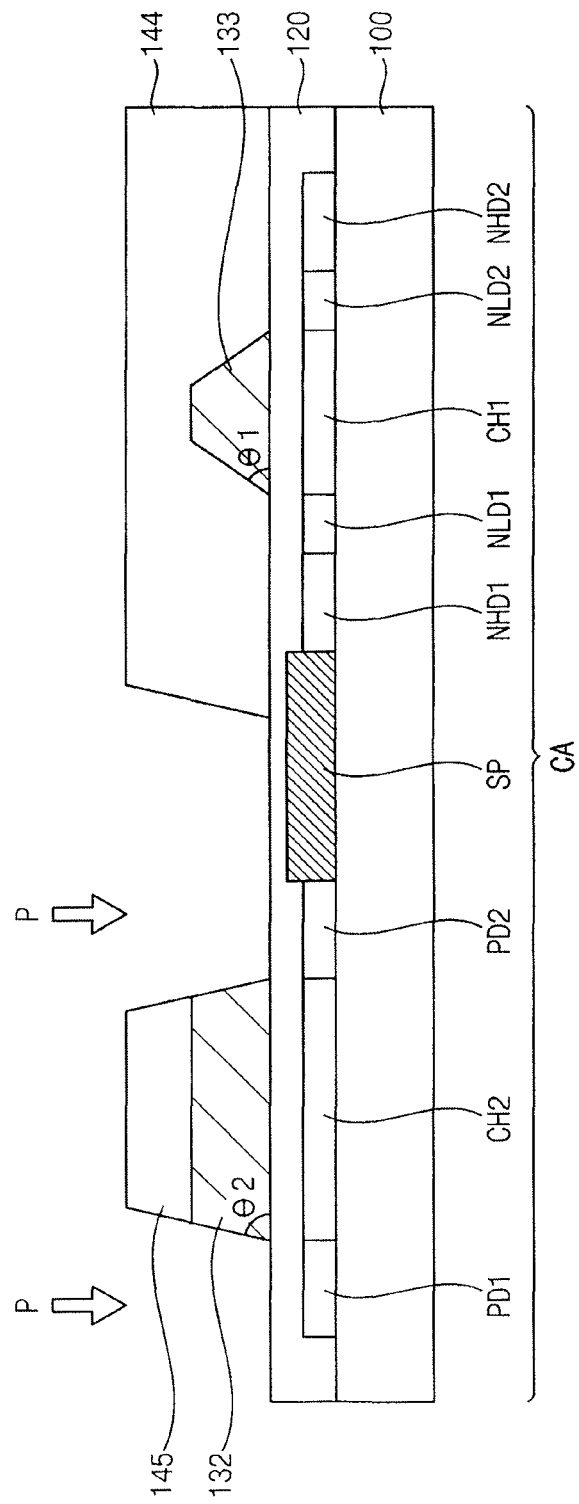

Referring to FIG. 10, the gate metal layer 130 is etched using the second mask pattern 145 as mask to form a second gate electrode 132. The gate metal layer 130 may be etched, for example, by a dry-etching process using plasma or another process.

As the second gate electrode 132 is formed, the first insulation layer 120 may be exposed in an area surrounding or adjacent to the second gate electrode 132. Furthermore, the first insulation layer 120 may be partially etched by the dry-etching process to have a reduced thickness.

Thereafter, p-type impurities (e.g., boron or another material) may be provided to the second active area 114 through an exposed portion of the first insulation layer 120. As a result, a portion overlapping the second gate electrode 132 in the second active area 114 is protected by the second gate electrode 132. Thus, the portion remains without being doped to define a second channel area CH2. A peripheral portion surrounding and adjacent to the second channel area CH2 in the second active area 114 is doped with p-type impurities to form a first p-doped area PD1 and a second p-doped area PD2.

In an exemplary embodiment, the second p-doped area PD2 may contact the silicide area SP after the p-doping process.

As a result, a common active pattern CA including a PMOS area, an NMOS area, and the silicide area SP electrically connecting the PMOS area to the NMOS area is formed. The PMOS area includes the first p-doped area PD1, the second channel area CH2, and the second p-doped area PD2. The NMOS area includes the first high-concentration n-doped area NHD1, the first low-concentration n-doped area NLD1, the first channel area CH1, the second low-concentration n-doped area NLD2, and the second high-concentration n-doped area NHD2. Thus, the PMOS area may be electrically connected to the NMOS area without an additional bridge pattern.

Thus, processes for manufacturing the bridge pattern may be omitted, and damage to transistors by the processes may be prevented. Furthermore, since a size of an active pattern may be entirely increased, the capacitance of a capacitor using the common active pattern CA as an electrode may be increased.

Referring to FIG. 15, the PMOS area, the silicide area SP, and the NMOS area may be arranged along a first direction D1. The width W of the silicide area SP along a second direction D2 substantially perpendicular to the first direction D1 may be, for example, substantially the same as a width of the common active pattern CA.

The common active pattern CA may bend to extend along different directions or may have various widths. The width W of the silicide area SP may be substantially same as the width of the PMOS area or the NMOS area, which is adjacent to silicide area SP.

In an exemplary embodiment, the silicide metal pattern SM may be formed to have a width greater than the width of the common active pattern CA in view of process margins. Thus, as illustrated in FIG. 16, the width of the silicide metal pattern SM may be greater than the width of the silicide area SP or the common active pattern CA. In a plan view, the size of the silicide area SP may be, for example, about 30% to 90% of an entire area of the common active pattern CA, or may be about 40% to 80% in one embodiment.

As explained above, the first gate electrode 133 is formed through a dry-etching process and an ashing process, and the second gate electrode 132 is formed through a dry-etching process. Thus, a taper angle $\theta 1$ of the first gate electrode 133 may be less than a taper angle $\theta 2$ of the second gate electrode 132. The taper angle $\theta 1$ of the first gate electrode 133 may be determined according to an ashing time and an initial taper angle before the ashing process. For example, as the ashing time increases, the taper angle $\theta 1$ of the first gate electrode 133 may decrease.

In one embodiment, the taper angle θ1 of the first gate electrode 133 may be about 20° to about 80°. The taper angle θ2 of the second gate electrode 132 may be about 30° to about 90°. When the taper angle θ2 of the second gate electrode 132 is larger than 90° to form an inversely-tapered shape, an upper layer formed on the second gate electrode 132 may have defects due to a step. When the taper angle θ2 of the second gate electrode 132 is less than 30°, a hump may appear or a resistance may increase.

In one embodiment, the taper angle θ1 of the first gate electrode 133 may be about 30° to about 70°, and the taper angle θ2 of the second gate electrode 132 may be about 60° to about 90°.

In one embodiment, the difference between the taper angle θ1 of the first gate electrode 133 and the taper angle θ2 of the second gate electrode 132 may be about 20° to about 40°. When the difference between the taper angle θ1 of the first gate electrode 133 and the taper angle θ2 of the second gate electrode 132 is less than 20°, the length of the low-concentration n-doped areas in the NMOS transistor may be reduced. Thus, leakage current and off-current may increase.

When the difference between the taper angle θ1 of the first gate electrode 133 and the taper angle θ2 of the second gate electrode 132 is greater than 40°, the thickness of the first insulation layer 120 in an area exposed to both the dry-etching process and the ashing process (e.g., the high-concentration n-doped area) may excessively decrease, thereby deteriorating device characteristics. In one embodiment, the difference between the taper angle θ1 of the first gate electrode 133 and the taper angle θ2 of the second gate electrode 132 may be about 30° to about 40°, or may be about 35° to about 40°. The taper values discussed above are merely illustrative and may be different in other embodiments.

Figure 11:
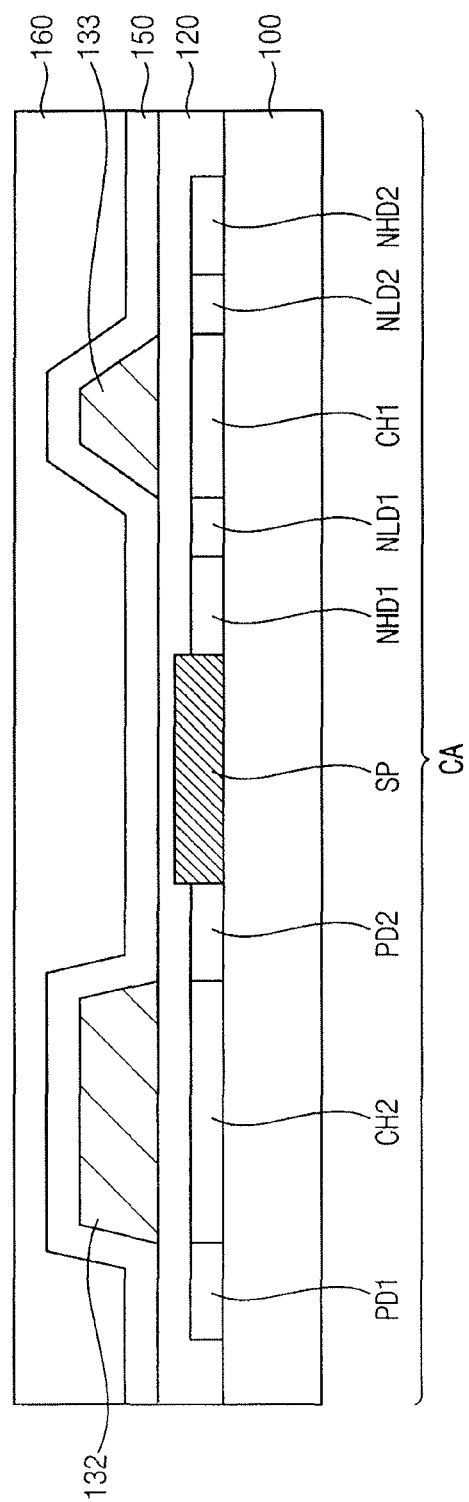

Referring to FIG. 11, the second photoresist layer 144 is removed, and a second insulation layer 150 is formed to cover the first gate electrode 133, the second gate electrode 132, and an exposed portion of the first insulation layer 120. The second insulation layer 150 may include, for example, silicon oxide, silicon nitride, silicon carbide, or a combination thereof. The second insulation layer 150 may include, for example, an insulating metal oxide such as aluminum oxide, tantalum oxide, hafnium oxide, zirconium oxide, titanium oxide, or another metal oxide. The second insulation layer 150 may have a single-layered structure or a multiple-layered structure including silicon nitride and/or silicon oxide.

Thereafter, a third insulation layer 160 is formed on the second insulation layer 120. The third insulation layer 160 may include, for example, silicon oxide, silicon nitride, silicon carbide, or a combination thereof. Furthermore, the third insulation layer 160 may include an insulating metal oxide such as aluminum oxide, tantalum oxide, hafnium oxide, zirconium oxide, titanium oxide, or another metal oxide. The third insulation layer 160 may have a single-layered structure or a multiple-layered structure including silicon nitride and/or silicon oxide. When the third insulation layer 160 includes an organic insulating material or further includes an organic insulation layer, the third insulation layer 160 may include, for example, polyimide, polyamide, acryl resin, phenol resin, or benzocyclobutene (BCB).

Figure 12:
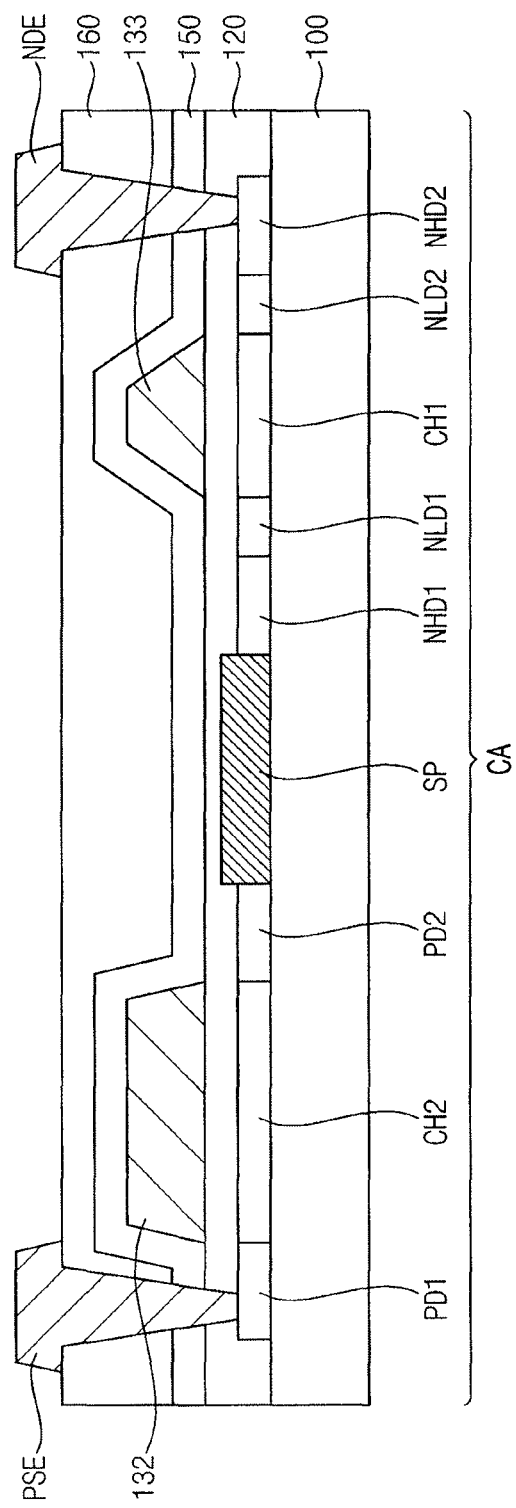

Referring to FIG. 12, the first insulation layer 120, the second insulation layer 150, and the third insulation layer 160 are patterned to form through-holes exposing the first p-doped area PD1 and the second high-concentration n-doped area NHD2.

Thereafter, a data metal layer is formed on the third insulation layer 160 and patterned to form a data metal pattern, including a source electrode PSE contacting the first p-doped area PD1 and a drain electrode NDE contacting the second high-concentration n-doped area NHD2. The data metal pattern may further include a data line and/or other features. The data metal layer may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The data metal layer may have a single-layered structure or a multiple-layered structure including different metal layers.

Figure 13:
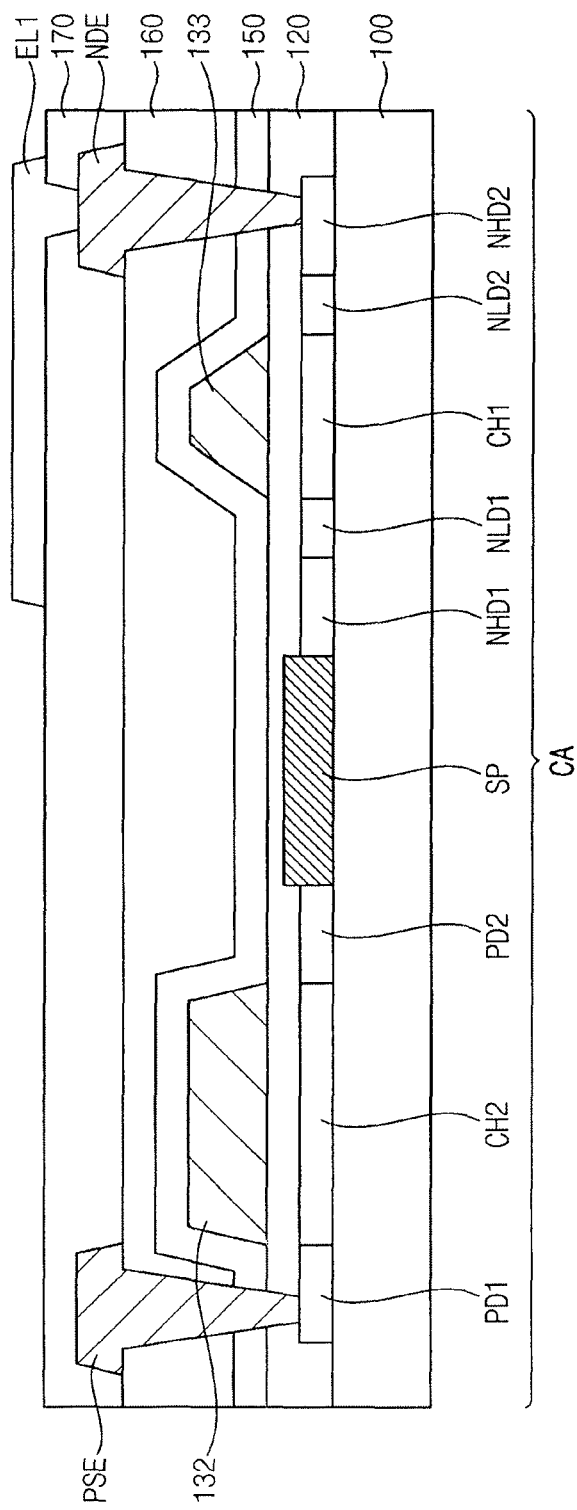

Referring to FIG. 13, a fourth insulation layer 170 is formed on the data metal pattern and patterned to expose the drain electrode NDE. A first electrode metal layer is formed on the fourth insulation layer 170 and patterned to form a first electrode EL1 contacting the drain electrode NDE. The fourth insulation layer 170 may include, for example, an inorganic insulating material, an organic insulating material, or a combination thereof as previously described.

The first electrode EL1 may be a pixel electrode of the display device. The first electrode EL1 may be formed as a transmitting electrode or a reflecting electrode according to an emission type of the display device. When the first electrode EL1 is a transmitting electrode, the first electrode EL1 may include, for example, indium tin oxide, indium zinc oxide, zinc tin oxide, indium oxide, zinc oxide, or tin oxide. When the first electrode EL1 is a reflecting electrode, the first electrode EL1 may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), or a combination thereof. The first electrode EL1 may have a stacked structure that further includes a material of the transmitting electrode.

Figure 14:
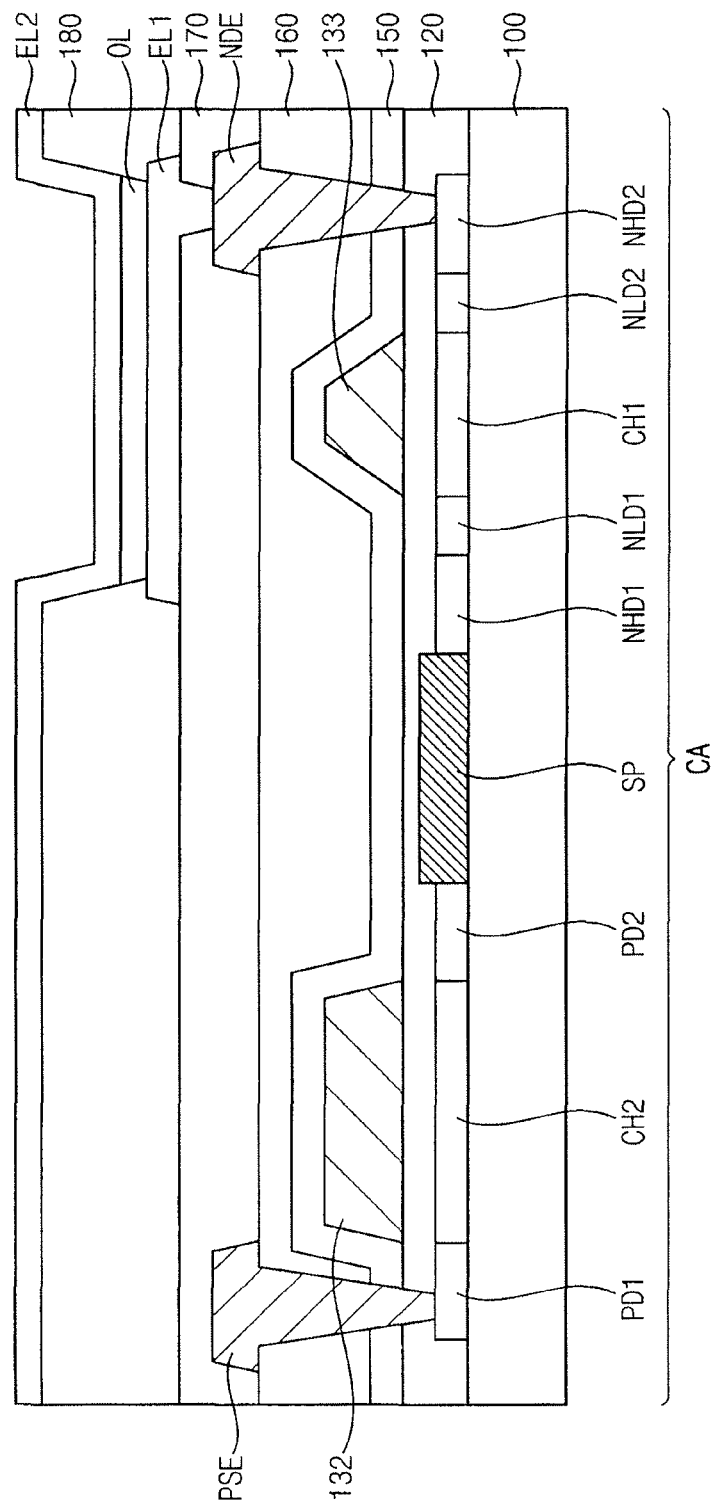

Referring to FIG. 14, a pixel-defining layer 180 is formed on the first electrode EL1 and the fourth insulation layer 170. The pixel-defining layer 180 includes an opening that exposes at least a portion of the first electrode EL1. The pixel-defining layer 180 may include, for example, an organic insulating material.

A light-emitting layer OL may be formed on the first electrode EL1. The light-emitting layer OL may include at least one functional layers such as a hole-injection layer, a hole-transporting layer, an organic light-emitting layer, an electron-transporting layer, an electron-injecting layer or the like. The light-emitting layer OL may have a single-layered structure and a multiple-layered structure.

The light-emitting layer OL may include, for example, a low molecular weight organic compound or a high molecular weight organic compound. Examples of the low molecular weight organic compound include copper phthalocyanine, N,N'-diphenylbenzidine, (tris-(8-hydroxyquinoline) aluminum or the like. Examples of the high molecular weight organic compound may include poly(3,4-ethylenedioxythiophene), polyaniline, poly-phenylenevinylene, or polyfluorene.

In an exemplary embodiment, the light-emitting layer OL may emit red light, green light, blue light, white light, or another color of light. The light-emitting layer OL emitting white light may have, for example, a multiple-layered structure including a red-emitting layer, a green-emitting layer, and a blue-emitting layer, or a single-layered structure including a mixture of a red-emitting material, a green-emitting material, and a blue-emitting material.

The light-emitting layer OL may be formed through a screen printing process, an ink-jet printing process, or another process.

A second electrode EL2 may be formed on the light-emitting layer OL. The second electrode EL2 may be formed as a transmitting electrode or a reflecting electrode according to an emission type of the display device. When the second electrode EL2 is a transmitting electrode, the second electrode EL2 may include, for example, lithium (Li), calcium (Ca), lithium fluoride (LiF), aluminum (Al), magnesium (Mg), or a combination thereof. The display device may further include a sub electrode or a bus electrode line, which includes indium tin oxide, indium zinc oxide, zinc tin oxide, indium oxide, zinc oxide, tin oxide, or another material.

In an exemplary embodiment, the organic light-emitting display device may be a front-emission type in which a light exits through the second electrode EL2. In one exemplary embodiment, the organic light-emitting display device may be a rear-emission type in which a light exits in an opposing direction.

According to an exemplary embodiment, a NMOS transistor may be a driving transistor electrically connected to the organic light-emitting diode, and a PMOS transistor may be an emission transistor configured to provide a power voltage ELVDD to the driving transistor based on an emission signal. In one exemplary embodiment, a PMOS transistor may be used for the driving transistor and an NMOS transistor may be used for the emission transistor. The PMOS transistor(s) may be formed after the NMOS transistor(s) is/are formed, or the NMOS transistor(s) may be formed after the PMOS transistor(s) is/are formed.

FIGS. 17-20 illustrate cross-sectional views of various stages of an embodiment of a process for forming a common active pattern including a silicide area. The process may be included in a method for manufacturing a display device as described herein.

Figure 17:
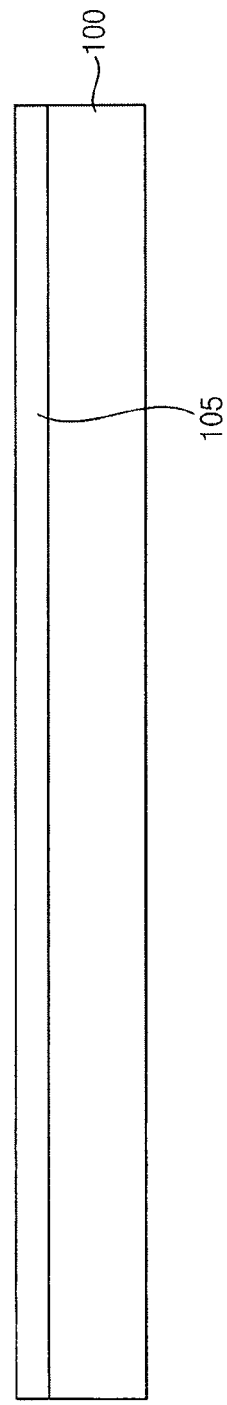
FIGS. 17-20 illustrate various stages of an embodiment of a process for forming a common active pattern including a silicide area.

Referring to FIG. 17, an amorphous silicon layer 105 is formed on a base substrate 100.

Figure 18:
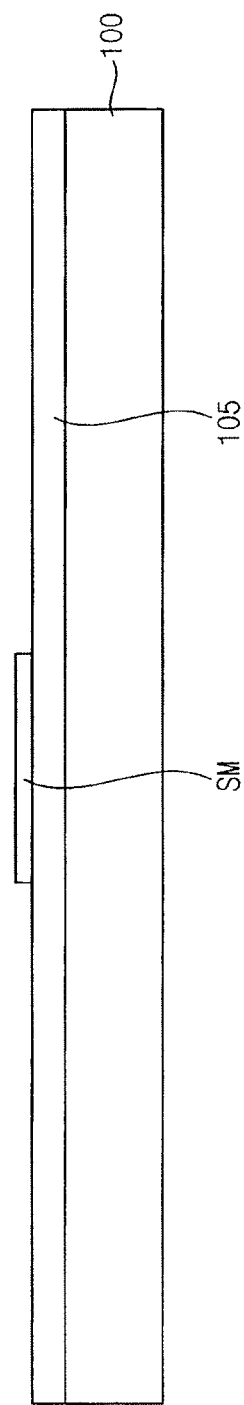

Referring to FIG. 18, a silicide metal pattern SM is formed to cover a portion of the amorphous silicon layer 105.

Figure 19:
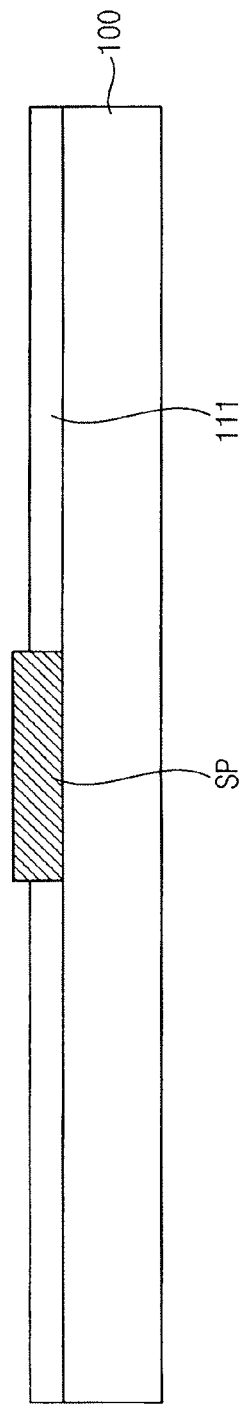

Referring to FIG. 19, a portion of the amorphous silicon layer 105, which overlaps the silicide metal pattern SM, is silicidized through a heating process to form a silicide area SP. Furthermore, the amorphous silicon layer 105 is crystallized to form a polysilicon layer 111. In one embodiment, the silicidation and the crystallization may be performed at the substantially same time. For example, silicidation and crystallization may be performed by a heating process using a furnace or the like, excimer laser annealing (ELA), sequential lateral solidification (SLS), or a combination thereof.

Figure 20:
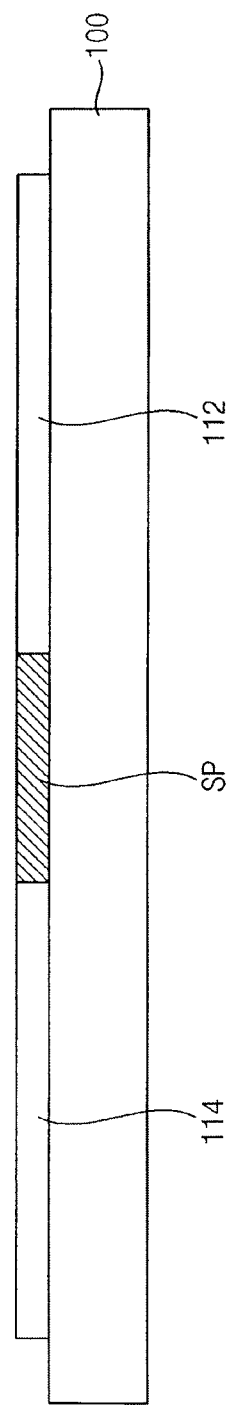

Referring to FIG. 20, the polysilicon layer 111 including the silicide area SP is patterned to form an active pattern including a first active area 112 and a second active area 114 spaced apart from the first active area 112 by the silicide area SP. For example, the polysilicon layer 111 may be polished by chemical mechanical polishing (CMP) or the like. In the process of polishing the polysilicon layer 111, the silicide area SP may be polished together. Thus, a step between the silicide area SP and the active area adjacent thereto may be reduced. The silicide area SP may have a thickness, for example, which is substantially same as the thickness of the active area adjacent thereto.

Thereafter, a display device may be manufactured through processes, for example, that are the same as explained with reference to FIGS. 5 to 14.

According to an exemplary embodiment, forming a silicide area and crystallizing an amorphous silicon layer may be performed in a same process. Thus, manufacturing efficiency may be improved, and a step due to the silicide area may be easily reduced.

Figure 21:
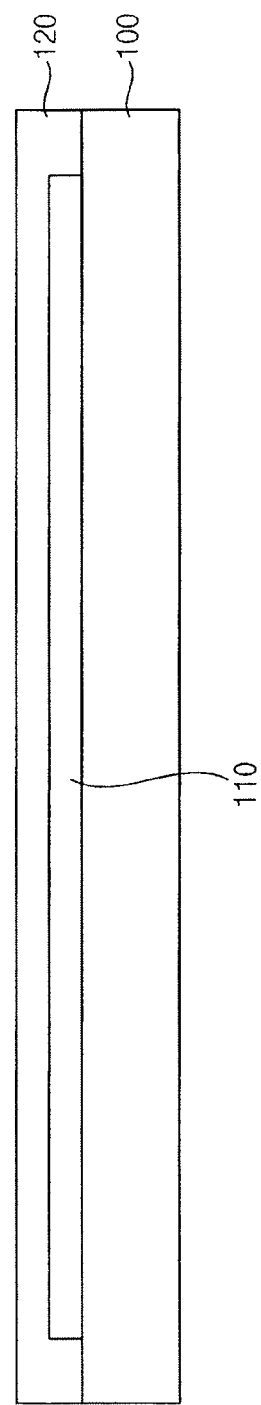
FIGS. 21-30 illustrate various stages of another embodiment of a method for manufacturing a display device.

FIGS. 21-30 illustrate cross-sectional views of various stages of another embodiment of a method for manufacturing a display device. Referring to FIG. 21, a semiconductor pattern 110 is formed on a base substrate 100, and a first insulation layer 120 is formed to cover the semiconductor pattern 110.

Figure 22:
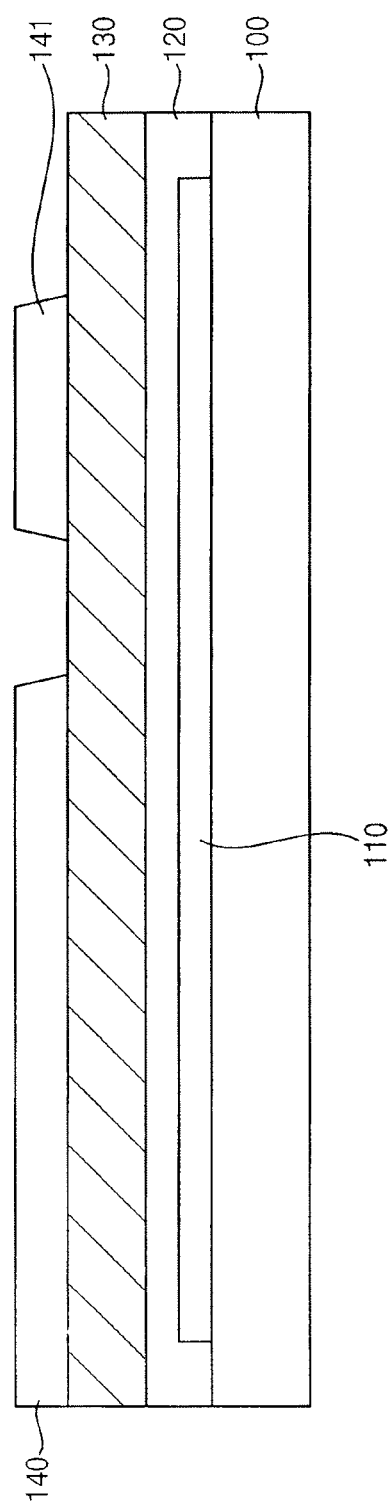

Referring to FIG. 22, a gate metal layer 130 is formed on the first insulation layer 120, and a first photoresist layer 140 is formed on the gate metal layer 130. The first photoresist layer 140 exposes a portion of the gate metal layer 130. For example, the first photoresist layer 140 may include a first mask pattern 141 overlapping a portion of the semiconductor pattern 110.

Figure 23:
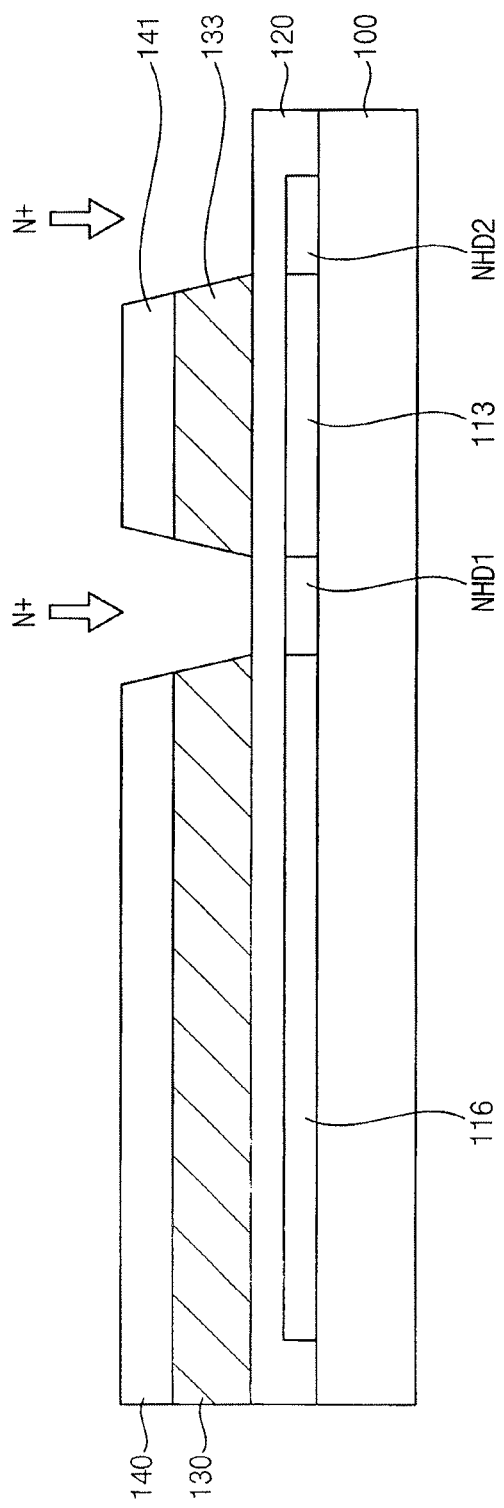

Referring to FIG. 23, the gate metal layer 130 is etched using the first photoresist layer 140 including the first mask pattern 141 to form a gate preliminary pattern 131.

Thereafter, n-type impurities (e.g., phosphorus, arsenic or another material) may be provided to the semiconductor pattern 110, through an exposed portion of the first insulation layer 120, with a predetermined high concentration to form a first high-concentration n-doped area NHD1 and a second high-concentration n-doped area NHD2.

Figure 24:
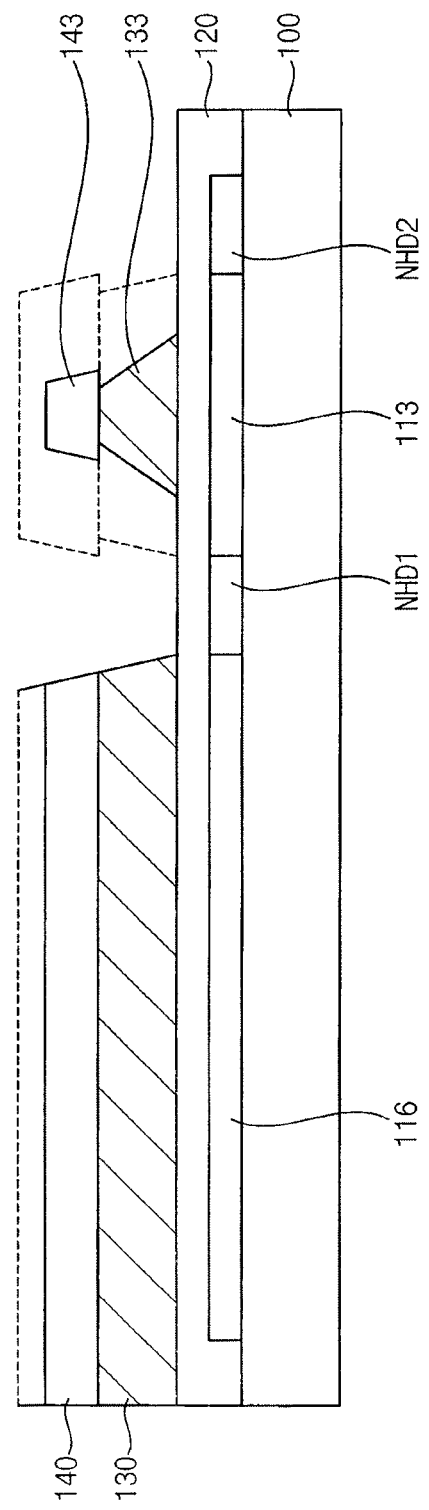

Referring to FIG. 24, the gate preliminary pattern 131 and the first mask pattern 141 are etched by an ashing process. As a result of the ashing process, the width of the gate preliminary pattern 131 is reduced to form a first gate electrode 133. Also, the first insulation layer 120 is exposed in an area surrounding an adjacent to the first gate electrode 133.

Figure 25:
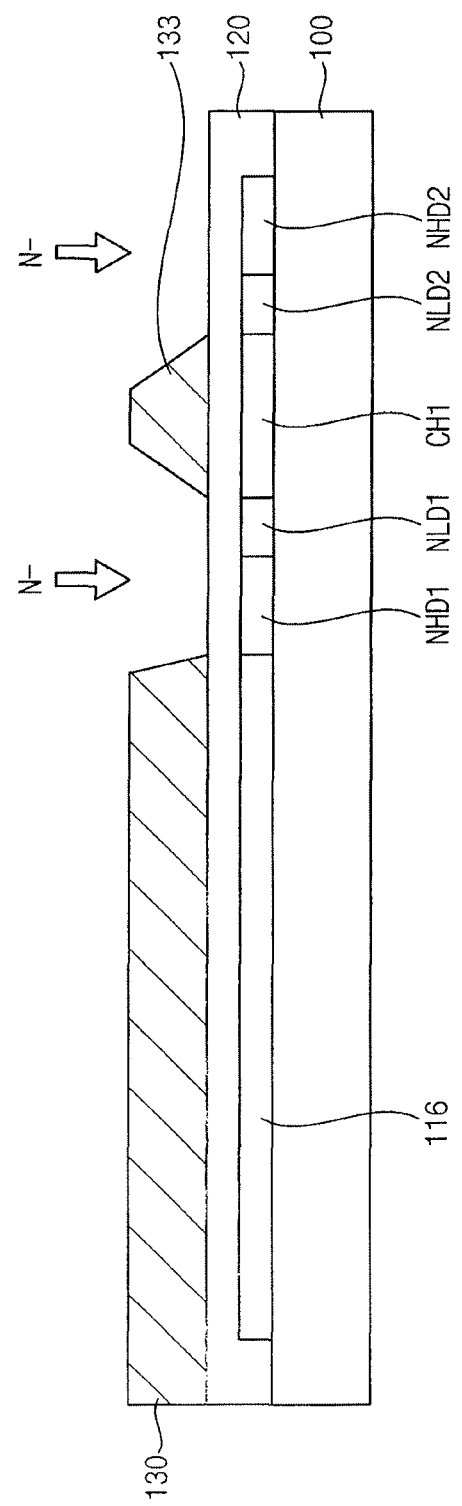

Referring to FIG. 25, n-type impurities (e.g., phosphorus, arsenic or another material) may be provided to a gate-overlapping portion 113, through an exposed portion of the first insulation layer 120, with a predetermined low concentration to form a first low-concentration n-doped area NLD1 and a second low-concentration n-doped area NLD2. As a result, a first channel area cm is defined by a portion remaining without being doped.

Figure 26:
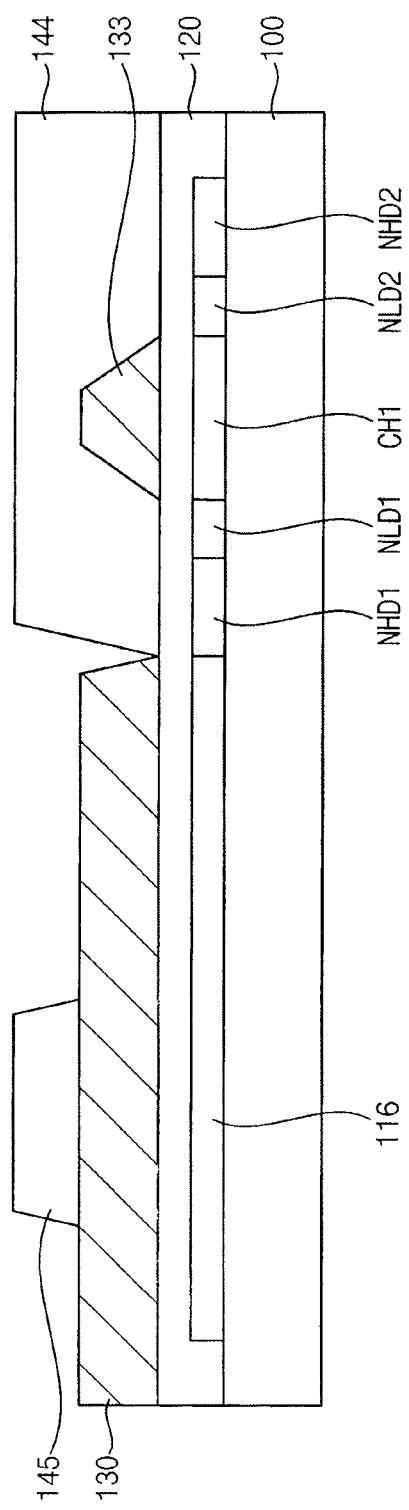

Referring to FIG. 26, a second photoresist layer 144 is formed. The second photoresist layer 144 covers the first gate electrode 133 and the first insulation layer 120 and partially exposes the gate metal layer 130. For example, the second photoresist layer 144 may include a second mask pattern 145 partially overlapping the gate metal layer 130 and a remaining semiconductor pattern 116.

Figure 27:
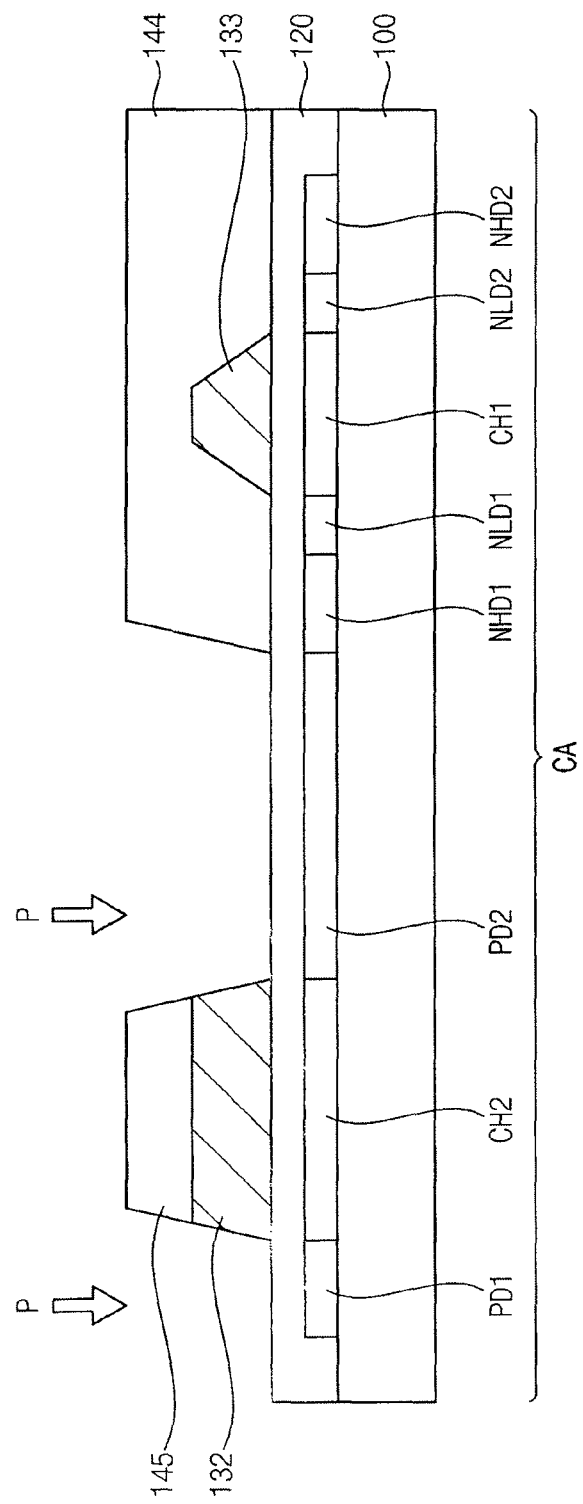

Referring to FIG. 27, the gate metal layer 130 is etched using the second mask pattern 145 as a mask to form a second gate electrode 132. As the second gate electrode 132 is formed, the first insulation layer 120 is exposed in an area surrounding an adjacent to the second gate electrode 132.

Thereafter, p-type impurities (e.g., boron or another material) may be provided to the remaining semiconductor pattern 116 through an exposed portion of the first insulation layer 120. As a result, a peripheral portion of the remaining semiconductor pattern 116, which does not overlap the second gate electrode 132, is doped with p-type impurities to form a first p-doped area PD1 and a second p-doped area PD2. A portion overlapping the second gate electrode 132 in the remaining semiconductor pattern 116 is protected by the second gate electrode 132. Thus, the portion remains without being doped to define a second channel area CH2.

As a result, a common active pattern CA including a PMOS area, an NMOS area, and the silicide area SP electrically connecting the PMOS area to the NMOS area is formed. The PMOS area includes the first p-doped area PD1, the second channel area CH2, and the second p-doped area PD2. The NMOS area includes the first high-concentration n-doped area NHD1, the first low-concentration n-doped area NLD1, the first channel area CH1, the second low-concentration n-doped area NLD2, and the second high-concentration n-doped area NHD2.

Figure 28:
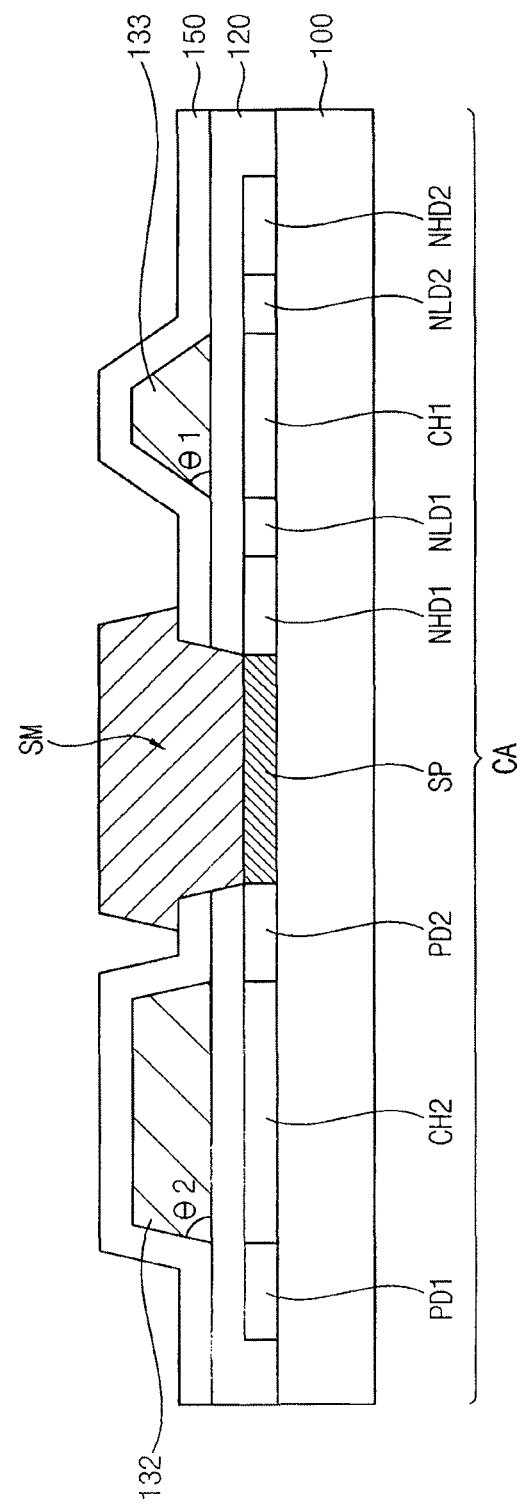

Referring to FIG. 28, the second photoresist layer 144 is removed, and a second insulation layer 150 is formed to cover the first gate electrode 133, the second gate electrode 132, and the first insulation layer 120.

Thereafter, an opening is formed through the first insulation layer 120 and the second insulation layer 150. The opening exposes the common active pattern CA between the first gate electrode 133 and the second gate electrode 132. For example, the opening may expose a portion of the second p-doped area PD2 or a portion of the first high-concentration n-doped area NHD1.

Thereafter, a metal layer is formed on the second insulation layer 150 and patterned to form a silicide metal pattern SM contacting the common active pattern CA through the opening. For example, the silicide metal pattern SM may contact the second p-doped area PD2 or the first high-concentration n-doped area NHD1.

Thereafter, a silicide area SP is formed at the common active pattern CA through a heating process. As the silicide area SP is formed, the length of the second p-doped area PD2 or the first high-concentration n-doped area NHD1 may be reduced.

The silicide metal pattern SM may be electrically connected to a data line, power lines ELVDD and ELVSS, and/or other lines or wirings to accomplish the intended application. For example, the silicide metal pattern SM may have a relatively large thickness to be used for connection with other electrodes or wirings. Thus, the silicide metal pattern SM may include a metal, which is not silicidized, except for a portion adjacent to the common active pattern CA. The silicide metal pattern SM may be formed from a metal layer used for forming other electrodes or wirings.

Figure 29:
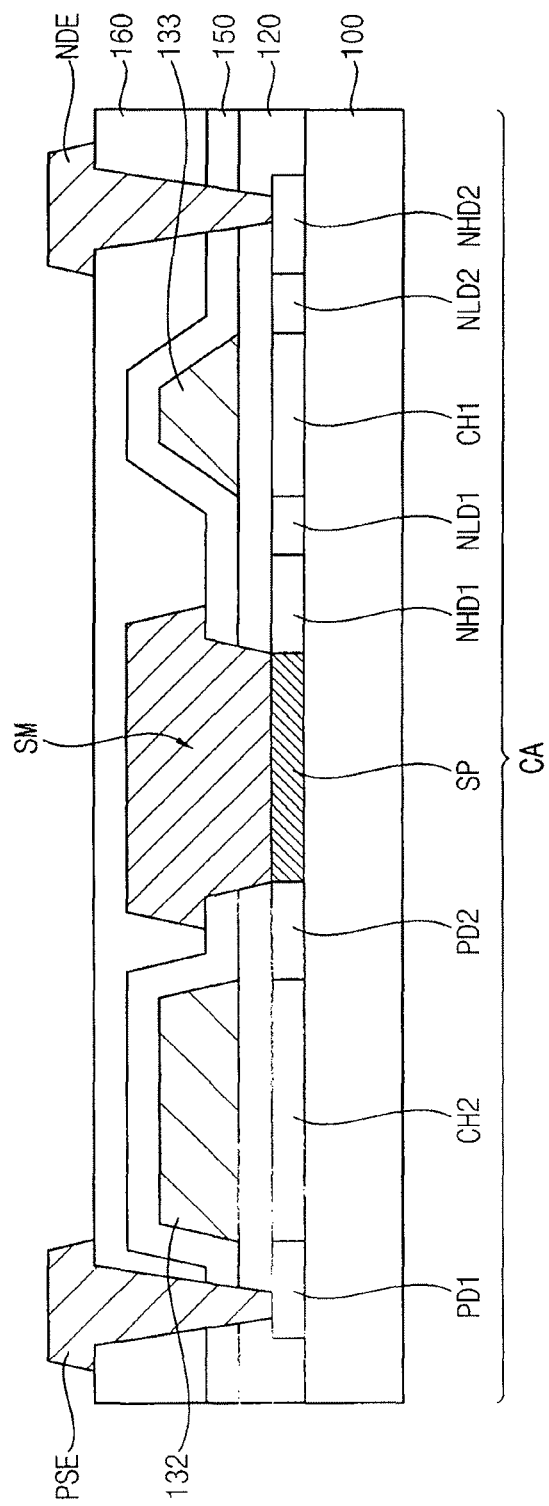

Referring to FIG. 29, a third insulation layer 160 is formed to cover the second insulation layer 150 and the silicide metal pattern SM.

Thereafter, the first insulation layer 120, the second insulation layer 150 and the third insulation layer 160 are patterned to form through-holes exposing the first p-doped area PD1 and the second high-concentration n-doped area NHD2.

Thereafter, a data metal layer is formed on the third insulation layer 160 and patterned to form a data metal pattern including a source electrode PSE contacting the first p-doped area PD1 and a drain electrode NDE contacting the second high-concentration n-doped area NHD2.

Figure 30:
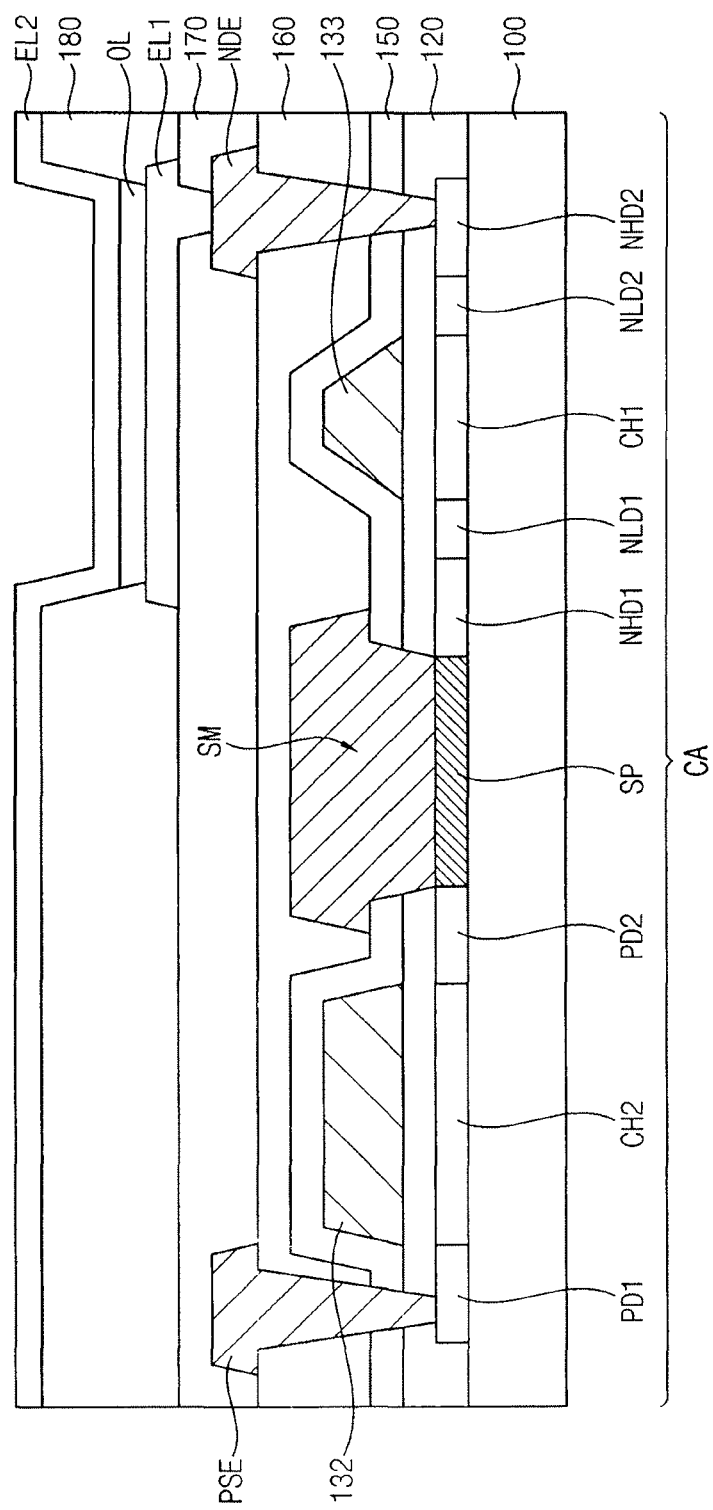

Referring to FIG. 30, a fourth insulation layer 170 is formed on the data metal pattern and patterned to expose the drain electrode NDE. A first electrode metal layer is formed on the fourth insulation layer 170 and patterned to form a first electrode EL1 contacting the drain electrode NDE.

A pixel-defining layer 180 is formed on the first electrode EL1 and the fourth insulation layer 170. The pixel-defining layer 180 includes an opening that exposes at least a portion of the first electrode ELL A light-emitting layer OL may be formed on the first electrode EL1. A second electrode EL2 may be formed on the light-emitting layer OL.

Figure 31:
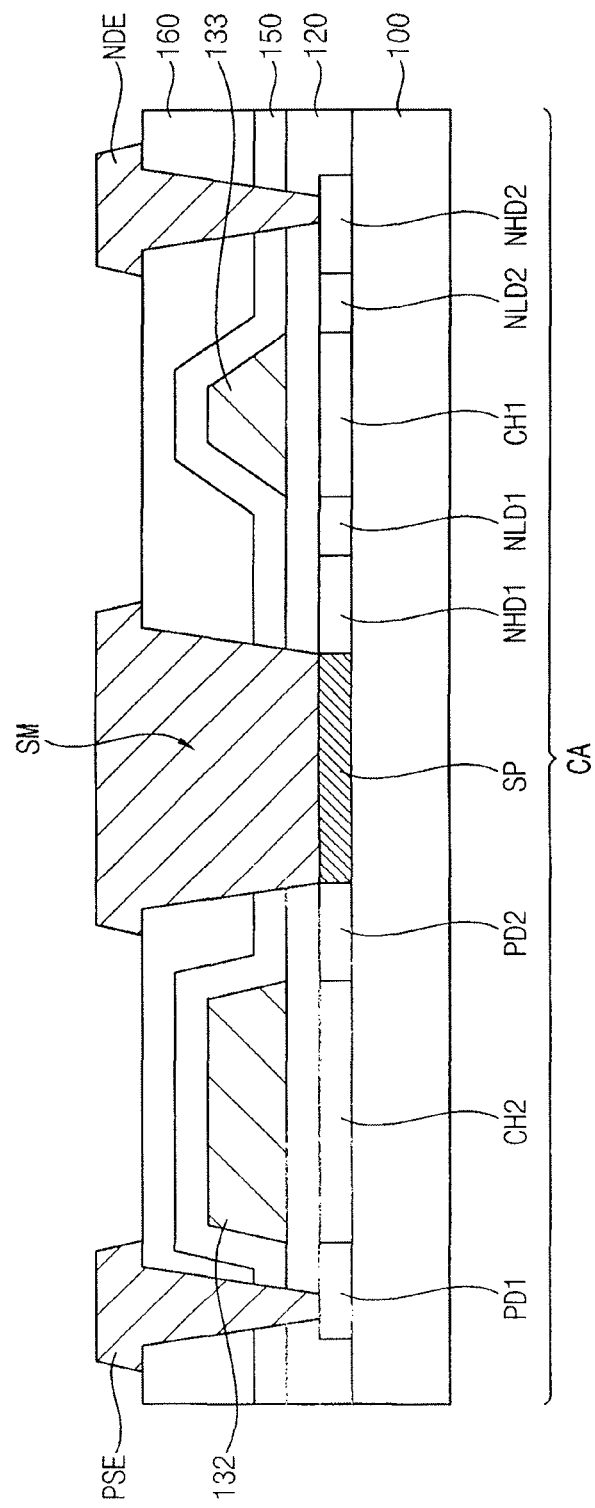
FIG. 31 illustrates an embodiment of a process for forming a silicide metal pattern.

FIG. 31 illustrates an embodiment of a process for forming a silicide metal pattern SM, which may be included in a method for manufacturing a display device as described herein.

Referring to FIG. 31, the silicide metal pattern SM may be formed from a data metal layer. Thus, a data metal pattern formed from the data metal layer may include a source electrode PSE contacting a PMOS area, a drain electrode NDE contacting an NMOS area, and the silicide metal pattern SM. Thus, the silicide metal pattern SM may be disposed in a same layer as the source electrode PSE and the drain electrode NDE.

In accordance with one or more of the aforementioned embodiments, a silicide metal pattern is formed from a data metal layer. Thus, a silicide area may be formed without an additional photolithography process, and a contact with a data metal pattern may be easily formed.

Exemplary embodiments described herein may be used for manufacturing a display device including a pixel circuit as illustrated, for example, in FIG. 1. The pixel circuit in FIG. 1 has three transistors, where the second transistor TR2 and the third transistor TR3 are NMOS transistors and the first transistor TR1 is a PMOS transistor. In other embodiments, the pixel circuit may have a different number of transistors and/or capacitors. In these or other example embodiments, a display device may be manufactured to have various other circuit configurations including NMOS and PMOS transistors. In other embodiments, more than three transistors Furthermore, exemplary embodiments are not limited to a pixel circuit and may, for example, be used to manufacture circuits of a gate driving part, a data driving part, or another portion of a display device. Exemplary embodiments may be used for an organic light-emitting display device, or may be used to manufacture integrated circuits for a different type of display device (e.g., liquid crystal display device) or a device that is different from or even unrelated to a display device, e.g., all or a portion of the methods described herein may be used to manufacture transistors in any device having a CMOS configuration.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
  a common active pattern including an NMOS area, a PMOS area and a silicide area in a same layer as the NMOS area and the PMOS area and electrically connecting the NMOS area to the PMOS area, the NMOS area including a first channel area and an n-doped area contacting the first channel area, the PMOS area including a second channel area and a p-doped area contacting the second channel area;
  a first gate electrode overlapping the first channel area; and a second gate electrode overlapping the second channel area.

2. The display device as claimed in claim 1, wherein:
the n-doped area includes a first high-concentration n-doped area, a first low-concentration n-doped area, a second low-concentration n-doped area, and a second high-concentration n-doped area,
the p-doped area includes a first p-doped area and a second p-doped area, and
the silicide area contacts the first high-concentration n-doped area and the second p-doped area.

3. The display device as claimed in claim 1, wherein the silicide area includes at least one of titanium silicide, nickel silicide, tantalum silicide, platinum silicide, cobalt silicide, and tungsten silicide.

4. The display device as claimed in claim 1, wherein a thickness of the silicide area is greater than a thickness of the NMOS area or the PMOS area adjacent to the silicide area.

5. The display device as claimed in claim 1, wherein a thickness of the silicide area is equal to a thickness of the NMOS area or the PMOS area adjacent to the silicide area.

6. The display device as claimed in claim 1, further comprising:
an organic light-emitting diode to receive a driving current through the common active pattern.

7. The display device as claimed in claim 1, wherein a width of the silicide area is equal to a width of the NMOS area or the PMOS area adjacent to the silicide area.

8. The display device as claimed in claim 1, wherein a depth of a silicidized portion in the silicide area is about 10 Å to about 1,000 Å.

9. The display device as claimed in claim 1, further comprising:
a first insulation layer covering the common active pattern,
wherein the first gate electrode and the second gate electrode are on the first insulation layer.

10. The display device as claimed in claim 9, further comprising:
a second insulation layer covering the first gate electrode, the second gate electrode, and the first insulation layer; and
a silicide metal pattern passing through the first insulation layer and the second insulation layer to contact the silicide area.

11. The display device as claimed in claim 10, further comprising:
a source electrode passing through the first insulation layer and the second insulation layer to contact the common active pattern; and
a drain electrode passing through the first insulation layer and the second insulation layer to contact the common active pattern, wherein the silicide metal pattern is in a same layer as the source electrode and the drain electrode.

* * * * *